United States Patent [19]

Helmut et al.

[11] Patent Number: 5,023,686

[45] Date of Patent: Jun. 11, 1991

[54] PIN-FET COMBINATION WITH BURIED P-LAYER

[75] Inventors: Albrecht Helmut, Munich; Christl Lauterbach, Siegertsbrunn, both of Fed. Rep. of Germany

[73] Assignee: Siemens Aktiengesellschaft, Berlin and Munich, Fed. Rep. of Germany

[21] Appl. No.: 538,786

[22] Filed: Jun. 15, 1990

[30] Foreign Application Priority Data

Jun. 27, 1989 [DE] Fed. Rep. of Germany ....... 3921027

[51] Int. Cl.$^5$ ........................................... H01L 27/14
[52] U.S. Cl. ...................................... 357/30; 357/19;
357/16; 357/41; 357/55; 357/47
[58] Field of Search ................. 357/30 G, 30 P, 30 D, 357/30 I, 41, 47, 55, 16, 19

[56] References Cited

U.S. PATENT DOCUMENTS 4,821,090 4/1989 Yokoyama ........................., 357/16 X

FOREIGN PATENT DOCUMENTS 3135462 9/1983 Fed. Rep. of Germany .
3711617 10/1988 Fed. Rep. of Germany .
3719743 12/1988 Fed. Rep. of Germany .
62-119981 6/1987 Japan ................................ 357/19 X

OTHER PUBLICATIONS

Albrecht, "Monolithically Integrated InGaAs/InP:Fe Photodiode-Junction Field Effect Transistor Combination," *Siemens Forsch.-M. Entwickl.-Ber.*, vol. 17, No. 4, (1988), pp. 195-198, Mar. 23.
Miura et al., "A Monolithically Integrated AlGaAs/GaAs P-I-N/FET Photoreceiver by MOCVD," *IEEE Electron Device Letters*, vol. EDL-4, No. 10, Oct. 1983, pp. 375-376.
Anderson et al., "Planar, Linear GaAs Detector-Amplifier Array with an Insulating AlGaAs Spacing Layer Between the Detector and Transistor Layers", *IEEE Electron Device Ltrs.*, vol. 9, No. 10, Oct. 1988, pp. 550-552.
Chen et al., "A Strip-Geometry InGaAs P/InP Heterojunction Bipolar Transistor Suitable for Optical Integration," *IEEE Electronic Device Letters*, vol. EDL-8, No. 5, May 1987, pp. 191-193.
Steiner et al., "Influence of P-INP Buffer Layers on Submicron in GaAs/INP Junction Field-Effect Transistors", *Am. Inst. of Physics*, Dec. 19, 1988, pp. 2513-2515.

*Primary Examiner*—William Mintel
*Attorney, Agent, or Firm*—Hill, Van Santen, Steadman & Simpson

[57] ABSTRACT

A PIN-FET combination having a basic layer, a first semiconductor layer as an absorption layer or, resepectively, a buffer layer, a second semiconductor layer as a contact layer or, respectively, as a channel layer and a third semiconductor layer as a cover layer grown surface-wide on a substrate. The p+-region of the photodiode and, respectively, the gate region of the FET being fashioned therein. The basic layer is undoped or n-doped in the region of the photodiode and is p-doped in the region of the FET and a surface-wide, p-doped layer portion is present in the region of the FET between the channel layer and the substrate.

20 Claims, 1 Drawing Sheet

PIN-FET COMBINATION WITH BURIED P-LAYER

BACKGROUND OF THE INVENTION

The present invention relates to PIN-FET devices. Future interfaces between optical and electronic components of optical data transmission systems will contain monolithically integrated optoelectronic circuits. The problem of the integration of a photodetector and a preamplifier arises at the receiver side. What are required are good compatibility of the semiconductor layers and technologies needed for the various components. One difficulty in the monolithic integration of a photodiode with a field effect transistor (FET) lies in the different demands made of the doping concentrations and layer thicknesses.

For a high external quantum efficiency, an optimized photodiode requires an adequately thick absorption layer of, for example, n-InGaAs in the InGaAsP material system with low residual doping. This nominally undoped InGaAs layer is a prerequisite for a low capacitance as well as a low dark current, and, consequently, for good noise properties. The $p^+$-region into which the light is incident through an annular p-contact is fashioned in an n-doped cover layer of InP or InAlAs. A highly doped, n-conductive semiconductor layer of, for example, InGaAs, InP or InAlAs for reducing the series resistance and the transit time effects, i.e. the carrier transit time in the diode is applied between the absorption layer and the substrate of, for example, semi-insulating InP:Fe. The n-contact is applied on this highly doped semiconductor layer.

For a high transconductance, the FET requires a highly doped n-InGaAs layer as channel layer that must be correspondingly thin for a good cut-off behavior of the FET. A lightly doped n-InGaAs layer as buffer layer that prevents disturbing influences from the substrate (out-diffusion of iron into the channel layer) follows in the direction toward the substrate of, for example, InP:Fe. The $p^+$-doped region that is laterally limited and provided with a contact is situated on the channel layer. The contacts for drain and source are applied on the channel layer. The condition for the insertion of the buffer layer is that the cut-off behavior of the FET is not negatively influenced, i.e. this buffer layer cannot be excessively thick (less than 2 $\mu$m) and the doping cannot be excessively high (less than $10^{15}$ cm$^{-3}$). The cover layer that forms the gate is n-InP or, respectively, n-InAlAs and forms a heterobarrier toward the InGaAs of the channel layer and enables the realization of a blocking metal-to-semiconductor junction as gate. This layer also has the advantage that a passivation of the pn-junction and the component surface increases the long-term stability and reduces leakage currents due to the higher band spacing of InP or, respectively, InAlAs in comparison to InGaAs. This advantage is valid both for a PIN or photodiode (PD) as well as for the FET.

In order to avoid complicated epitaxy processes (for example, surface-selective epitaxy) or, respectively, the erosion of individual epitaxy layers in the integration of PD and FET, compromises are made with respect to the layer structure.

German published application DE 37 11 617 A1 discloses a PD-FET combination wherein a lightly n-doped InGaAs layer and a highly n-doped InGaAs layer thereon are grown-surface wide and wherein a $n^+$-implantation had been selectively produced before the epitaxy in the region of the photodiode in the substrate.

SUMMARY OF THE INVENTION

An object of the present invention is to provide a monolithically integrated photodiode-FET combination that can be more simply manufactured than known combinations and wherein the different demands made of the doping concentration and layer thickness for the photodiode and for the FET are simultaneously taken into consideration.

This object is achieved with the photodiode-FET combination having the following grown on one another on a substrate of III-V semiconductor material; an absorption layer having low doping for a first conductivity type, a contact layer having high doping for this first conductivity type, and a first cover layer having a region formed therein that extends from the surface of the first cover layer down to the contact layer and that is doped for the opposite, second conductivity type, whereby the absorption layer, the contact layer and the first cover layer are provided for the photodiode, and further having the following also grown on one another on the substrate, a buffer layer having low doping for the first conductivity type, a channel layer having high doping for the first conductivity type, and a second cover layer having a gate region fashioned therein, whereby the buffer layer, the channel layers and the second cover layer are provided for the FET, and having contacts for the electrical connection of the photodiode and of the FET. The photodiode - FET combination then comprises: a basic layer of semiconductor material grown surface-wide on the substrate; a first semiconductor layer grown surface-wide thereon, said first semiconductor layer forming the absorption layer in the region of the photodiode and forming the buffer layer in the region of the FET; a second semiconductor layer grown surface-wide thereon, said semiconductor layer forming the contact layer in the region of the photodiode and forming the channel layer in the region of the FET; a third semiconductor layer grown surface-wide thereon, said third semiconductor layer forming the respective cover layers; a first layer portion doped for the second conductivity type present surface-wide between the substrate and the channel layer in the region of the FET; and the photodiode and the FET separated from one another by a parting trench that extends down into the substrate. In an alternative embodiment the photodiode-FET combination comprises: a first semiconductor layer grown surface-wide on the substrate, said first semiconductor layer forming the absorption layer in the region of the photodiode and forming the buffer layer in the region of the FET; a second semiconductor layer grown surface-wide thereon, said second semiconductor layer forming the contact layer in the region of the photodiode and forming the channel layer in the region of the FET; a third semiconductor layer grown surface-wide thereon, said third semiconductor layer forming the respective cover layer, a first layer portion of the substrate doped for the second conductivity type present surface-wide at the overgrown surface of the substrate, said doped layer portion being separated surface-wide from the absorption layer in the region of the photodiode by a second layer portion of the substrate that is doped for the first conductivity type and adjoining the buffer layer surface-wide in the region of the FET; and the photodiode and the FET separated from one another by a parting trench that extends down into the substrate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
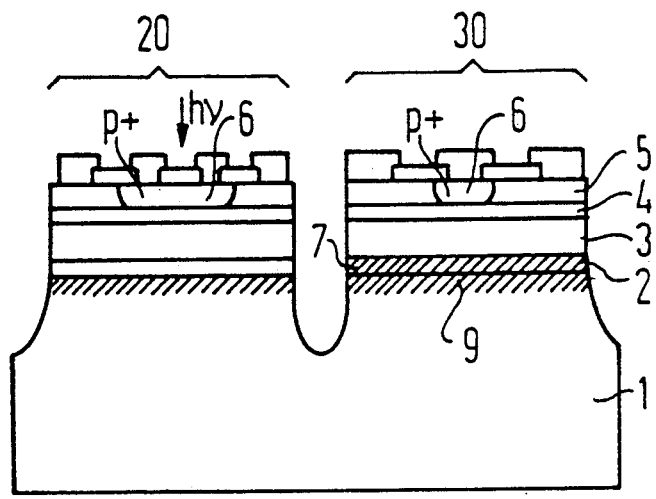
FIGS. 1, 2 and 3 are cross-sectional views of the photodiode-FET combination of the present invention with reference to three especially advantageous embodiments.

Given the structure of FIG. 1, a basic layer 2 of semiconductor material and, further, a first semiconductor layer 3, a second semiconductor layer 4 and a third semiconductor layer 5 are each respectively grown surface-wide in succession on a substrate 1. This layer structure is subdivided by a vertical parting trench into the region of the photodiode 20 and the region of the FET 30. The first semiconductor layer 3 forms an absorption layer 20-3 in the region of the photodiode 20 and forms a buffer layer 30-3 in the region of the FET 30. The second semiconductor layer 4 forms a contact layer 20-4 in the region of the photodiode 20 and forms a channel layer 30-4 in the region of the FET 30. The third semiconductor layer 5 forms a respective cover layer in the region of the photodiode 20 and in the region of the FET 30. The substrate 1 is InP and is semi-insulating (for example, InP:Fe). The basic layer 2 has a thickness of 0.5 μm through 3 μm and is InP, InGaAs, InAlAs, InGaAsP or InGaAlAs. With the semiconductor material systems InAlAs, InGaAsP or InGaAlAs, this basic layer 2 can be fashioned as an optical waveguide layer. This basic layer 2 is provided for the photodiode 20 and is undoped or, respectively, n-doped with a doping level below $10^{18} cm^{-3}$. Since, without additional measures, this basic layer 2 would significantly deteriorate the properties of the FET (no cut-off behavior, high channel leakage currents), a layer portion 7 doped for p-conduction is established in this basic layer 2 in the region of the FET 30 with a selective p-doping (p-ion implantation or p-diffusion). This p-doped layer portion 7 is present surface-wide in the region of the FET 30. During the manufacture, the epitaxy is interrupted after the growth of the basic layer 2 and this p-doped layer portion 7 is produced by selective p-doping. In a second epitaxy step, the further semiconductor layer 3, 4, 5 are grown. The first and second semiconductor layer 3, 4 are InGaAs. The third semiconductor layer 5 is InP, InAlAs, InGaAsP or InGaAlAs. The first semiconductor layer 3 is lightly $n^-$-highly conductively doped and the second semiconductor layer 4 is highly $n^+$ conductively doped. The $p^-$ doped regions 6 are introduced by a p-ion implantation or p-diffusion into the third semiconductor layer 5 functioning as cover layer. This third semiconductor layer 5 is undoped or n-doped outside of the $p^+$ doped regions 6. In the manufacture, alternatively, a p-doped, third semiconductor layer 5 can be grown on as cover layer (doping below $10^{19} cm^{-3}$), this being subsequently doped for n-conduction outside of the $p^+$ region 6 and forming a pn-hetero junction in combination with the channel layer 30-4 (of, for example, $n^-$-InGaAs).

The advantages of this buried, selective p-junction of the present invention in the region of the FET 30 between the basic layer 30-2 (p-doped in the region of the FET 30) and the buffer layer 30-3 ($n^-$-doped) grown thereon are:

1. The cut-off properties of the FET are significantly improved and the short channel effects are reduced (K. Steiner, U. Seiler, K. Heime, "Influence of p-InP Buffer Layers on Submicron InGaAs/InP Junction Field-Effect Transistors", Appl. Phys. Lett. 53 2513–2515, 1988).

2. Due to the formation of the space charge zone of the buried p-junction, the $n^-$-InGaAs buffer layer 30-3 can have a greater layer thickness than in traditional semiconductor layer structures for FETs. This first semiconductor layer 3 thus has an adequate thickness in order (as absorption layer 20-3 of the photodiode 20) to enable a high quantum efficiency and a low diode capacitance. The influence of the doping in the first semiconductor layer 3 ($n^-$-InGaAs absorption layer 20-3) also becomes less critical (doping level below $10^{16} cm^{-3}$).

Figure 2:
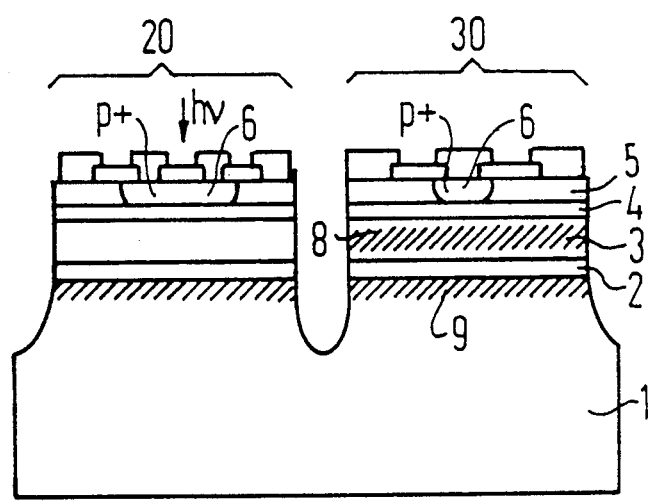

Given the structure shown in FIG. 2, the p-doped layer portion 8 of FET 30 has been manufactured with the assistance of a deep, selective p-ion implantation after the growth of the basic layer 2 and of the three semiconductor layers 3, 4, 5.

As shown in FIG. 2, this p-doped layer portion 8 can lie in the first semiconductor layer 3 or thereunder in the basic layer 2.

A p-doped, upper layer portion 9 of the substrate is additionally entered in FIGS. 1 and 2. The semi-insulating substrate 1 is rendered p-conductive at the overgrown surface on the basis of a surface-wide p-ion implantation or, respectively, p-diffusion. Together with the basic layer 2 or, respectively, in the case of FIG. 1, together with that part of this basic layer 2 situated in the region of the photodiode 20 and the buffer layer 30-3 in the region of the FET 30, this upper p-doped layer portion 9 of the substrate 1 forms a blocking pn-junction. Due to this blocking pn-junction, the insulating properties of the substrate 1 are improved and shunt currents across the substrate between the photodiode 20 and FET 30 are reduced. A further p-doped layer between substrate 1 and basic layer 2 can also be grown on instead of the p-doped layer portion 9 at the surface of the substrate 1.

Figure 3:
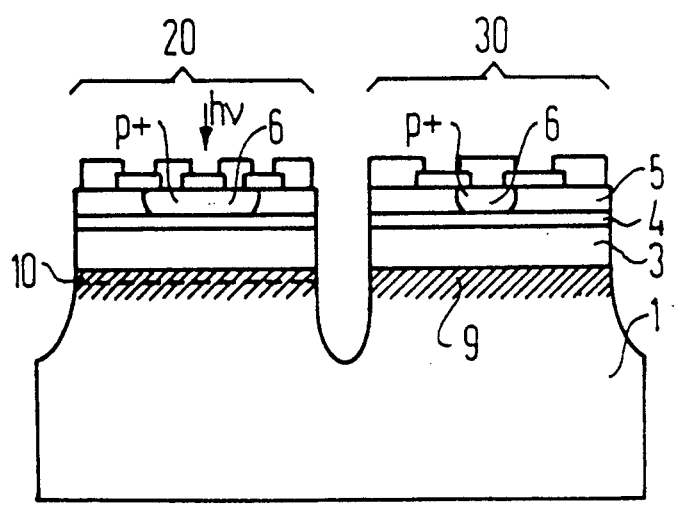

In the alternative embodiment of FIG. 3, a blocking pn-junction is provided between the first semiconductor layer 3 and the substrate layer 1. A p-doped layer portion 9 is thereby formed at the overgrown surface of the substrate 1 on the basis of a surface-wide p-ion implantation or, respectively, p-diffusion into the substrate 1. The basic layer 2 and the p-doped layer portion between the channel layer 30-4 and the substrate 1 in the region of the FET 30 can thereby be foregone. In order to improve the growth conditions of the first, second and third semiconductor layers 3, 4, 5, a basic layer 2 of the semiconductor material can be grown extremely thin (less than 50 nm). Instead, the uppermost layer portion of this p-doped layer portion 9 is n-doped surface wide in the region of the photodiode 20. In the region of FET 30, thus, the p-doped layer portion 9 of the substrate 1 is immediately adjacent at the buffer layer 30-3. This n-doped layer portion 10 of the substrate 1 is situated surface-wide between the p-doped layer portion 9 of the substrate 1 and the absorption layer 20-3 (portion of the first semiconductor layer 3 in the region of the photodiode 20) in the region of the photodiode 20. This n-doped layer portion 10 of the substrate is produced after the surface-wide p-doping by a selective n+-ion implantation or, respectively, n+-diffusion into the substrate 1 in the region of the later photodiode 20. The semiconductor layers 3, 4, 5 can therefore be epitaxially grown on in succession without interruption. A significant simplification of the manufacturing process derives therefrom.

The operational signs of the doping (n-doping or p-doping) of the exemplary embodiments as set forth above can also be reversed. All described structures are suitable for integration of further optoelectronic components such as, for example, optical waveguides (basic layer 2) and/or an additional pin photodiode for the combination of double pin photodiode and FET.

The electrical connection of the semiconductor components in all of the described structures (FIGS. 1 through 3) ensues with a contact metallization. Separate contact depositions having different metallization sequences and additional alloying steps are required for this for the p-contact and the n-contact. An improvement of the n-contacting properties of photodiode and FET (drain and source) is achieved by eroding the cover layer (third semiconductor layer 5) in the region of these contacts down to the channel layer 30-4 or, respectively, down to the contact layer 20-4. In order to improve the p-contacting properties, an epitaxially grown contact layer (for example, InGaAs) can also be inserted between the cover layer and the metallization level). The parting trench or trenches are respectively drawn to such an extent into the substrate 1 that the p-doped layer portion 9, insofar as it is present, is completely parted, i.e. the parting trench extends down into the semi-insulating material of the substrate 1.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A Photodiode-FET combination having the following grown on one another on a substrate (1) of III-V semiconductor material;
   an absorption layer (20-3) having low doping for a first conductivity type,
   a contact layer (20-4) having high doping for this first conductivity type, and
   a first cover layer (20-5) having a region (20-6) formed therein that extends from the surface of the first cover layer (20-5) down to the contact layer (20-4) and that is doped for an opposite, second conductivity type,
   whereby the absorption layer, the contact layer and the first cover layer (20-3, 20-4, 20-5) form a photodiode (20),
   a buffer layer (30-3) having low doping for the first conductivity type,
   a channel layer (30-4) having high doping for the first conductivity type, and
   a second cover layer (30-5) having a gate region (30-6) therein;
   whereby the buffer layer, the channel layer and the second cover layer (30-3, 30-4, 30-5) form an FET (30), and
   having contact for the electrical connection of the photodiode (20) and of the FET (30),
   a basic layer (2) of semiconductor on the substrate (1);
   a first semiconductor layer (3) on the basic layer (2), said first semiconductor layer forming the absorption layer (20-3) in the region of the photodiode (20) and forming the buffer layer (30-3) in the region of the FET (30);
   a second semiconductor layer (4) on the first semiconductor layer (3), said second semiconductor layer forming the contact layer (20-4) in the region of the photodiode (20) and forming the channel layer (30-4) in the region of the FET (30);
   a third semiconductor layer (5) on the second semiconductor layer (4), said third semiconductor layer forming the respective cover layers (20-5, 30-5);
   a first layer portion (7, 8) doped for the second conductivity type located between the substrate (1) and the channel layer (30-4) in the region of the FET (30); and the photodiode (20) and the FET (30) separated from one another by an isolating trench that extends down into the substrate (1).

2. A Photodiode-FET combination having the following grown on one another on a substrate (1) of III-V semiconductor material;
   an absorption layer (20-3) having low doping for a first conductivity type,
   a contact layer (20-4) having high doping for this first conductivity type, and
   a first cover layer (20-5) having a region (20-6) formed therein that extends from the surface of the first cover layer (20-5) down to the contact layer (20-4) and that is doped for an opposite, second conductivity type,
   whereby the absorption layer, the contact layer and the first cover layer (20-3, 20-4, 20-5) form a photodiode (20),
   a buffer layer (30-3) having low doping for the first conductivity type,
   a channel layer (30-4) having high doping for the first conductivity type, and
   a second cover layer (30-5) having a gate region (30-6) therein,
   whereby the buffer layer, the channel layer and the second cover layer (30-3, 30-4, 30-5) form an FET (30), and
   having contacts for the electrical connection of the photodiode (20) and of the FET (30),
   a first semiconductor layer (3) on the substrate (1), said first semiconductor layer forming the absorption layer (20-3) in the region of the photodiode (20) and forming the buffer layer (30-3) in the region of the FET (30);
   a second semiconductor layer (4) on the first semiconductor layer (3), said second semiconductor layer forming the contact layer (20-4) in the region of the photodiode (20) and forming the channel layer (30-4) in the region of the FET (30);
   a third semiconductor layer (5) on the second semiconductor layer (4), said third semiconductor layer forming the respective cover layers (20-5, 30-5);
   a first layer portion (9) of the substrate (1) doped for the second conductivity type and located at the surface of the substrate (1), said doped first layer portion being separated from the absorption layer (20-3) in the region of the photodiode (20) by a second layer portion (10) of the substrate (1) that is doped for the first conductivity type and being adjacent the buffer layer (30-3) in the region of the FET (30); and the photodiode (20) and the FET (30) separated from one another by an isolating trench that extends down into the substrate (1).

3. A Photodiode-FET combination according to claim 1, wherein the first layer portion (7) doped for the second conductivity type is formed in the basic layer (2) by selective doping before the growth of the first semiconductor layer (3).

4. A Photodiode-FET combination according to claim 1, wherein the first layer portion (8) doped for the second conductivity type is formed by selective ion implantation following the growth of the third semiconductor layer (5).

5. A Photodiode-FET combination according to claim 1, wherein a second layer portion (9) of the substrate (1) doped for the second conductivity type is adjacent to the overgrown surface of the substrate (1) and to the basic layer (2).

6. A Photodiode-FET combination according to claim 1, wherein a barrier layer doped for the second conductivity type is located between the substrate (1) and the basic layer (2).

7. A Photodiode-FET combination according to claim 1, wherein the first conductivity type is n-type and the second conductivity type is p-type.

8. A Photodiode-FET combination according to claim 1, wherein the first conductivity type is p-type and the second conductivity type is n-type.

9. A Photodiode-FET combination having the following grown on one another on a substrate of III-V semiconductor material;

an absorption layer having low doping for a first conductivity type, a contact layer having high doping for this first conductivity type, and a first cover layer having a region formed therein that extends from the surface of the first cover layer down to the contact layer and that is doped for the opposite, second conductivity type, whereby the absorption layer, the contact layer and the first cover layer form a photodiode, a buffer layer having low doping for the first conductivity type, a channel layer having high doping for the first conductivity type, and a second cover layer having a gate region therein, whereby the buffer layer, the channel layer and the second cover layer form an FET, and having contact for the electrical connection of the photodiode and of the FET, a basic layer of semiconductor material on the substrate;

a first semiconductor layer on the basic layer, said first semiconductor layer forming the absorption layer in the region of the photodiode and forming the buffer layer in the region of the FET;

a second semiconductor layer on the first semiconductor layer, said semiconductor layer forming the contact layer in the region of the photodiode and forming the channel layer in the region of the FET;

a third semiconductor layer on the second semiconductor layer, said third semiconductor layer forming the first and second cover layers for the photodiode and the FET, respectively; a layer portion doped for the second conductivity type located between the substrate and the channel layer in the region of the FET; the photodiode and the FET separated from one another by an isolating trench that extends down into the substrate; and the layer portion doped for the second conductivity type formed in the basic layer by selective doping before the growth of the first semiconductor layer.

10. A Photodiode-FET combination according to claim 9, wherein a layer portion of the substrate doped for the second conductivity type is adjacent to the overgrown surface of the substrate and to the basic layer.

11. A Photodiode-FET combination according to claim 9, wherein a barrier layer doped for the second conductivity type is located between the substrate and the basic layer.

12. A Photodiode-FET combination according to claim 9, wherein the first conductivity type is n-type and the second conductivity type is p-type.

13. A Photodiode-FET combination according to claim 9, wherein the first conductivity type is p-type and the second conductivity type is n-type.

14. A Photodiode-FET combination having the following grown on one another on a substrate of III-V semiconductor material;

an absorption layer having low doping for a first conductivity layer, a contact layer having high doping for this first conductivity type, and a first cover layer having a region formed therein that extends from the surface of the first cover layer down to the contact layer and that is doped for an opposite, second conductivity type, whereby the absorption layer, the contact layer and the first cover layer form a photodiode, a buffer layer having low doping for the first conductivity type, a channel layer having high doping for the first conductivity type, and a second cover type having a gate region therein, whereby the buffer layer, the channel layer and the second cover layer form an FET, and having contacts for the electrical connection of the photodiode and of the FET, a basic layer of semiconductor material on the substrate;

a first semiconductor layer on the basic layer, said first semiconductor layer forming the absorption layer in the region of the photodiode and forming the buffer layer in the region of the FET;

a second semiconductor layer on the first semiconductor layer, said semiconductor layer forming the contact layer in the region of the photodiode and forming the channel layer in the region of the FET;

a third semiconductor layer on the second semiconductor layer, said third semiconductor layer forming the first and second cover layers for the photodiode and the FET, respectively;

a layer portion doped for the second conductivity type located between the substrate and the channel layer in the region of the FET; and the photodiode and the FET separated from one another by an isolating trench that extends down into the substrate; and the layer portion doped for the second conductivity type formed by selective ion implantation following the growth of the third semiconductor layer.

15. A Photodiode-FET combination according to claim 14, wherein a layer portion of the substrate doped for the second conductivity type is adjacent to the overgrown surface of the substrate and to the basic layer.

16. A Photodiode-FET combination according to claim 14, wherein a barrier layer doped for the second conductivity type is located between the substrate and the basic layer.

17. A Photodiode-FET combination according to claim 14, wherein the first conductivity type is n-type and the second conductivity type is p-type.

18. A Photodiode-FET combination according to claim 14, wherein the first conductivity type is p-type and the second conductivity type is n-type.

19. A Photodiode-FET combination according to claim 2, wherein the first conductivity type is p-type and the second conductivity type is n-type.

20. A Photodiode-FET combination according to claim 2, wherein the first conductivity type is n-type and the second conductivity type is p-type.

* * * * *